(12) United States Patent
Kim

(10) Patent No.: US 7,259,569 B2
(45) Date of Patent: Aug. 21, 2007

(54) CALIBRATION CIRCUIT AND METHOD THEREOF

(75) Inventor: Woonyun Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/325,512

(22) Filed: Jan. 5, 2006

(65) Prior Publication Data
US 2006/0145706 A1 Jul. 6, 2006

(30) Foreign Application Priority Data
Jan. 5, 2005 (KR) .................. 10-2005-0000764

(51) Int. Cl.
 G01R 35/00 (2006.01)
 G01R 23/20 (2006.01)
(52) U.S. Cl. ...................... 324/601; 324/620
(58) Field of Classification Search ............ 324/601, 324/620
 See application file for complete search history.

(56) References Cited

U.S. PATENT DOCUMENTS 5,613,233 A * 3/1997 Vagher ................ 455/296
5,768,700 A * 6/1998 Kardontchik ............ 455/333
6,026,286 A   2/2000 Long

FOREIGN PATENT DOCUMENTS

JP  2002-141751  5/2002
JP  2004-104515  4/2004

* cited by examiner

Primary Examiner—Anjan Deb
Assistant Examiner—Amy He
(74) Attorney, Agent, or Firm—Harness, Dickey & Pierce, P.L.C.

(57) ABSTRACT

A calibration circuit and method thereof. In the example method, a common-mode voltage may be detected at an output port of a mixer. At least one common-mode feedback voltage may be generated (e.g., at one or more common-mode feedback circuits) based on the detected common-mode voltage. A loop gain may be adjusted in response to a gate control signal (e.g., received at a controller, such as a second order Intecept Point (IP2) controller). An impedance may be adjusted at the output port of the mixer and a current applied to the output port of the mixer may be adjusted based on the at least one common-mode feedback voltage. The example method may be performed by a calibration circuit (e.g., an IP2 calibration circuit).

21 Claims, 12 Drawing Sheets

CALIBRATION CIRCUIT AND METHOD THEREOF

PRIORITY STATEMENT

This application claims priority to Korean Patent Application No. 10-2005-0000764 filed on Jan. 5, 2005 in the Korean Intellectual Property Office, the entire contents of which are hereby incorporated by reference.

BACKGROUND OF THE INVENTION

1. Field of the Invention

Example embodiments of the present invention are directed generally to a calibration circuit and method thereof, and more particular to a calibration circuit including at least one common-mode feedback circuit and method thereof.

2. Description of the Related Art

A degree of linearity in Super Heterydyne systems may be represented by a third order intercept point (IP3). When input signals including two or more frequency components are applied to a conventional non-linear system or circuit, other frequency components may be generated due to non-linearity and/or input frequency components. These additional frequency components may be referred to as Intermodulation (IM), and IM distortion (IMD) may refer to distortion due to the IM components. When the two or more input frequency components are passed through the non-linear system/circuit, various output frequency components may be generated (e.g., a sum of harmonics and/or a difference of harmonics with random coefficients as well as the input frequency components may be generated), which may interfere with a modulation process and/or a demodulation process.

A conventional direct-conversion receiver (DCR) may not convert a carrier frequency signal into an intermediate frequency. Instead, a frequency mixer of the DCR may directly convert a carrier frequency signal into a base-band signal, and a second-order intermodulation distortion (IMD2) may approximate the frequency of the base-band signal. The DCR may thereby be more affected by the IMD2 as compared to a third-order intermodulation distortion (IMD3). Thus, distortion of signal waveforms may generally be adjusted (e.g., reduced) by controlling the IMD2.

A degree of interference due to the IMD2 may be represented by a second-order Intercept Point (IP2) value. The IP2 value may represent a degree of linearity of a conventional DCR system and may thereby be a factor in the performance of communication systems.

A power level of an initial IMD2 may be relatively low. However, the power level of the initial IMD2 may increase (e.g., at a higher rate) to be substantially equal to the power level of an input signal as a power level of the input signal increases. A point at which the power level of the IMD2 equals the power level of the original signal may be referred to as the IP2. In order to enhance the linearity in conventional communication systems, the IP2 value may be set to higher values so as to reduce the IMD2.

FIG. 1 is a circuit diagram illustrating a conventional IP2 calibration circuit 100. Referring to FIG. 1, the IP2 calibration circuit 100 may include a mixer 10 and an IP2 controller 20. The mixer 10 may include a first input terminal pair 2 where a radio frequency input signal VRF may be received and a second input terminal pair 4 where an output signal VLO of a local oscillator (not shown) may be received.

The mixer 10 may output a signal having a frequency corresponding to a difference between a frequency of the radio frequency input signal VRF and a frequency of the output signal VLO of the local oscillator (not shown) to an output terminal pair 6.

The IP2 controller 20 may include a first load resistor RLP, a second load resistor RLN and a calibration resistor RCAL. The calibration resistor RCAL may be coupled in parallel to the first load resistor RLP and/or the second load resistor RLN. The calibration resistor RCAL may compensate for a mismatch of the output terminal pair 6 of the mixer 10. The mixer 10 may output differential output signals VOP and VON. A total output voltage may be obtained by adding the output voltage of the IM2 from a common mode to the output voltage of the IM2 from a differential mode.

The output voltage $V_{IM2,cm}$ of the IM2 of the common mode may be represented by $$V_{IM2,cm}=icm(R+\Delta R-Rc)-icm(R-\Delta R)=icm(2\Delta R-Rc) \quad \text{Equation 1}$$

where Rc may denote a resistance value offset by the calibration resistor RCAL, RLP may be equal to (R+$\Delta$R) and RLN may be equal to (R−$\Delta$R) and icm may denote an IM2 current in the common mode.

The output voltage $V_{IM2,dm}$ of the IM2 in the differential mode may be represented by $$V_{IM2,dm}=idm(R+\Delta R-Rc)+idm(R-\Delta R)=idm(2R-Rc) \quad \text{Equation 2}$$

where Rc may denote a resistance value offset by the calibration resistor RCAL, RLP may be equal to (R+$\Delta$R), and RLN may be equal to (R−$\Delta$R) and idm may denote an IM2 current in the differential mode.

The total IM2 output voltage $V_{IM2}$ may be represented by $$V_{IM2}=V_{IM2,cm}+V_{IM2,dm}=idm(2R-Rc)+icm(2\Delta R-Rc) \quad \text{Equation 3}$$

Referring to Equation 3, the IP2 value may be calibrated by adjusting the resistance value Rc so as to reduce (e.g., minimize) the output voltage $V_{IM2}$.

The above-described method of calibrating the IP2 value may cause difficulties in a semiconductor manufacturing process. For example, the $\Delta$R may correspond to approximately 0.1%-10% of the resistance R, and the resistance value Rc may correspond to approximately 0.1%-10% of the resistance R. In order to implement such a broad range of the resistance value Rc, the calibration resistor RCAL may be set at a higher resistance value (e.g., between 10 and 1000 times higher than that of the resistance R). For example, if the resistance value of the resistor R is several tens of K$\Omega$, the resistance value of the calibration resistor RCAL may be set at several tens of M$\Omega$. Resistors with higher resistances may occupy higher amounts of space, thus complicating a manufacturing of semiconductors including the higher resistance resistors. Further, the IP2 calibration circuit 100 using the load resistors for calibrating the IP2 value may not have a sufficient voltage margin in a semiconductor device requiring a higher gain and/or a higher linearity.

SUMMARY OF THE INVENTION

An example embodiment of the present invention is directed to a calibration circuit, including a mixer configured to convert a radio frequency (RF) input signal into a base-band signal, a first common-mode feedback circuit configured to detect a common-mode voltage of an output port of the mixer to negatively feedback the common-mode voltage to generate a first common-mode feedback voltage, and a current supply circuit configured to supply a current to the output port of the mixer, the current supply circuit adjusting the current in response to the first common-mode feedback voltage.

Another example embodiment of the present invention is directed to a method of calibration, including detecting a common-mode voltage of an output port of a mixer, generating at least one common-mode feedback voltage based on the detected common-mode voltage, adjusting an impedance of at least one terminal of the output port and applying a current to the output port of the mixer, the applied current based on the at least one common-mode feedback voltage.

BRIEF DESCRIPTION OF THE DRAWINGS

The accompanying drawings are included to provide a further understanding of example embodiments of the present invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE INVENTION

Figure 1:
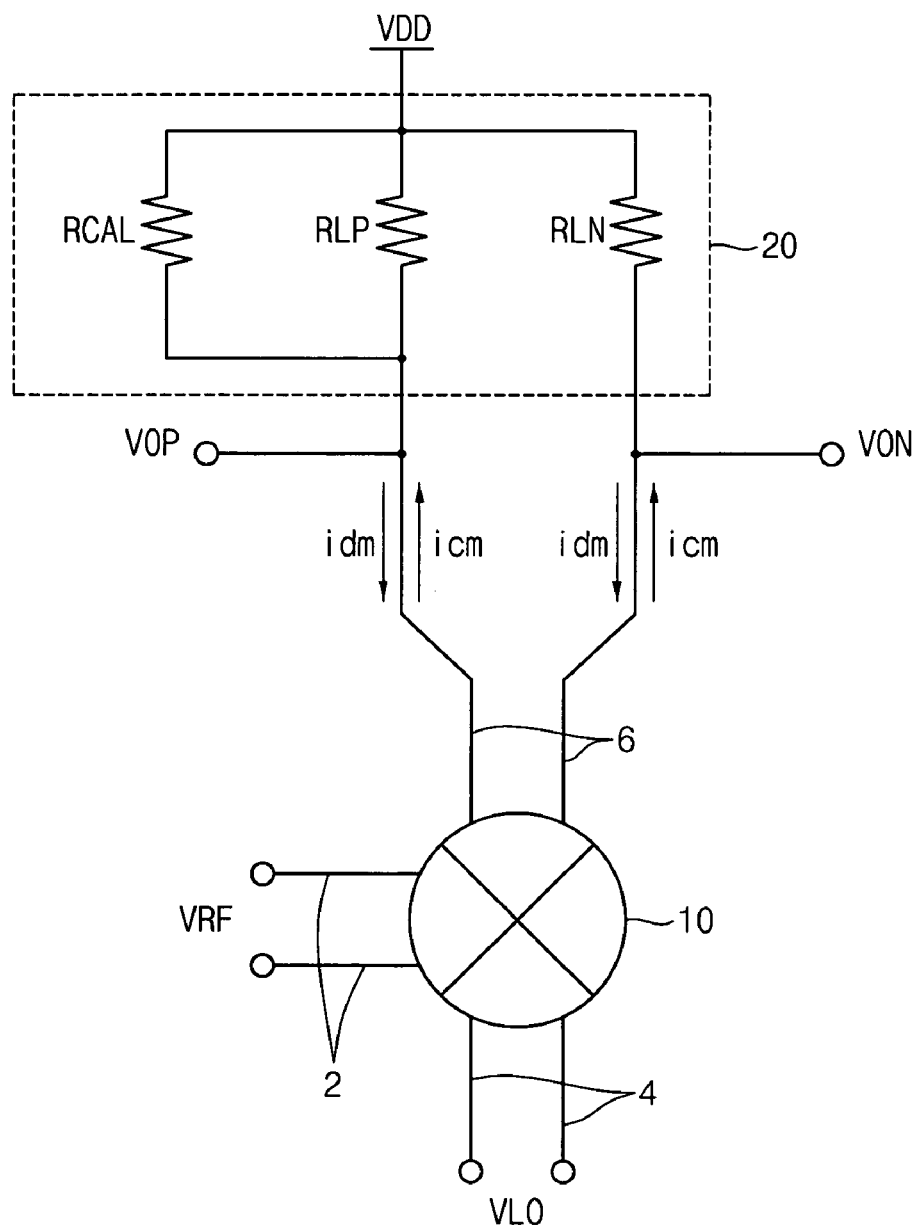
FIG. 1 is a circuit diagram illustrating a conventional second-order Intercept Point (IP2) calibration circuit.

Detailed illustrative example embodiments of the present invention are disclosed herein. However, specific structural and functional details disclosed herein are merely representative for purposes of describing example embodiments of the present invention. Example embodiments of the present invention may, however, be embodied in many alternate forms and should not be construed as limited to the embodiments set forth herein.

Accordingly, while example embodiments of the invention is susceptible to various modifications and alternative forms, specific embodiments thereof are shown by way of example in the drawings and will herein be described in detail. It should be understood, however, that there is no intent to limit example embodiments of the invention to the particular forms disclosed, but conversely, example embodiments of the invention is to cover all modifications, equivalents, and alternatives falling within the spirit and scope of the invention. Like numbers may refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. Conversely, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
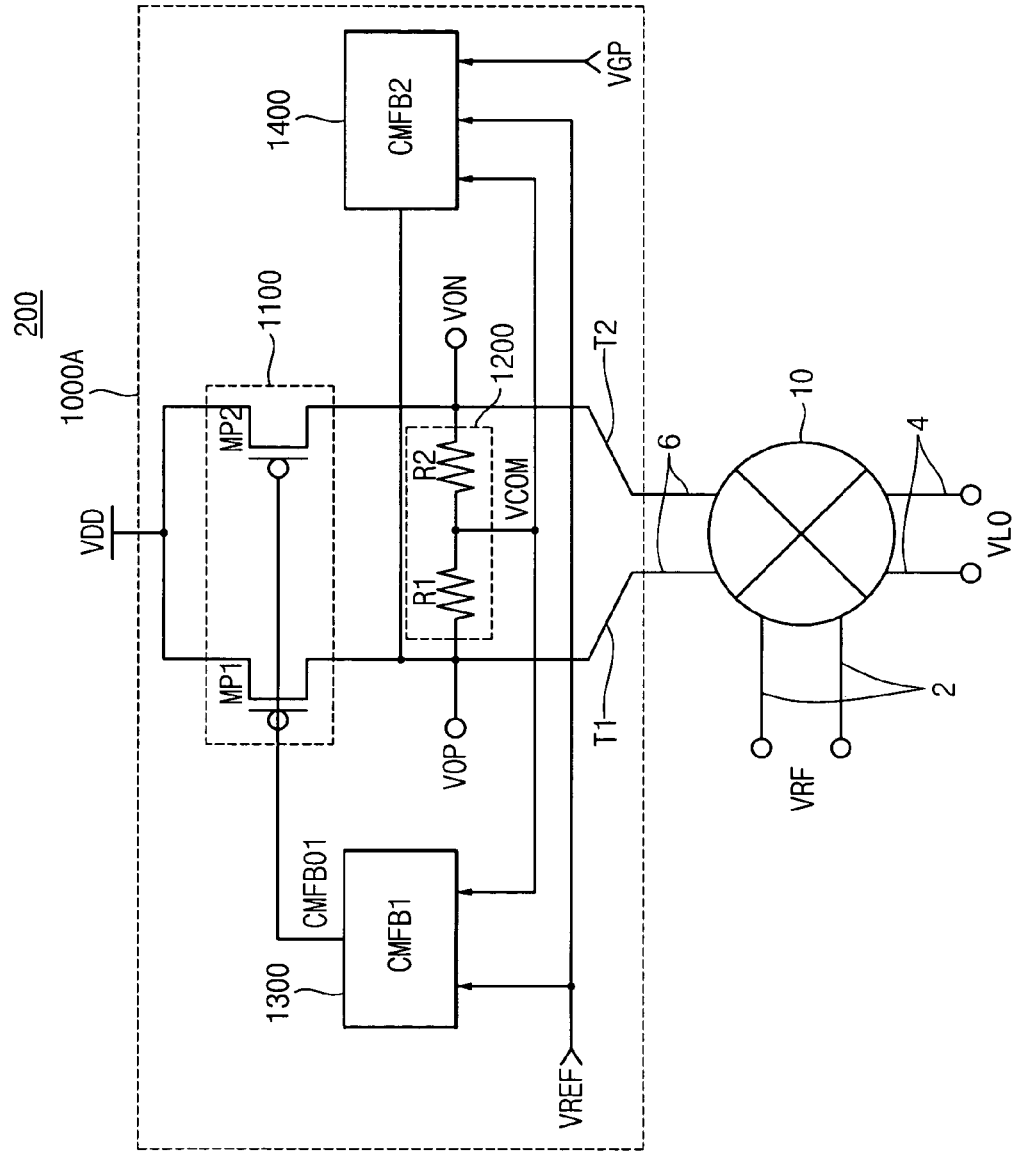
FIG. 2 is a circuit diagram illustrating an IP2 calibration circuit according to an example embodiment of the present invention.

FIG. 2 is a circuit diagram illustrating an IP2 calibration circuit 200 according to an example embodiment of the present invention.

In the example embodiment of FIG. 2, the IP2 calibration circuit 200 may include a mixer 10 and an IP2 controller 1000A. The IP2 controller 1000A may include a first common-mode feedback circuit 1300, a second common-mode feedback circuit 1400, a current supply circuit 1100 and a common-mode voltage generator 1200. The current supply circuit 1100 may include a first PMOS transistor MP1 and a second PMOS transistor MP2. The common-mode voltage generator 1200 may include a first resistor R1 and a second resistor R2. The mixer 10 may convert a radio frequency input signal having a carrier frequency to a base-band signal.

In the example embodiment of FIG. 2, the first common-mode feedback circuit 1300 may detect a common-mode voltage VCOM of an output port 6 coupled to the mixer 10 to receive the common-mode voltage VCOM as a negative feedback voltage through an inverted input of the first common-mode feedback circuit 1300. The first common-mode feedback circuit 1300 may generate a common-mode feedback voltage CMFB01.

In the example embodiment of FIG. 2, the second common-mode feedback circuit 1400 may detect the common-mode voltage VCOM of the output port 6 coupled to the mixer 10 to determine a loop gain based on a gate control signal VGP. The second common-mode feedback circuit 1400 may vary an impedance of a first terminal T1 of the output port 6. The current supply circuit 1100 may generate a variable current to the output port 6 coupled to the mixer 10 in response to the common-mode feedback voltage CMFB01.

In the example embodiment of FIG. 2, the common-mode voltage generator 1200 may receive a first output signal VOP from the first terminal T1 of the output port 6 and may receive a second output signal VON from a second terminal T2 of the output port 6 to generate the common-mode voltage VCOM. In an example, output signals of the mixer 10 may be differential signals.

In the example embodiment of FIG. 2, the common-mode voltage generator 1200 may receive the differential output signals VOP and VON to generate the common-mode voltage VCOM at a connection point of the first resistor R1 and the second resistor R2.

Figure 3:
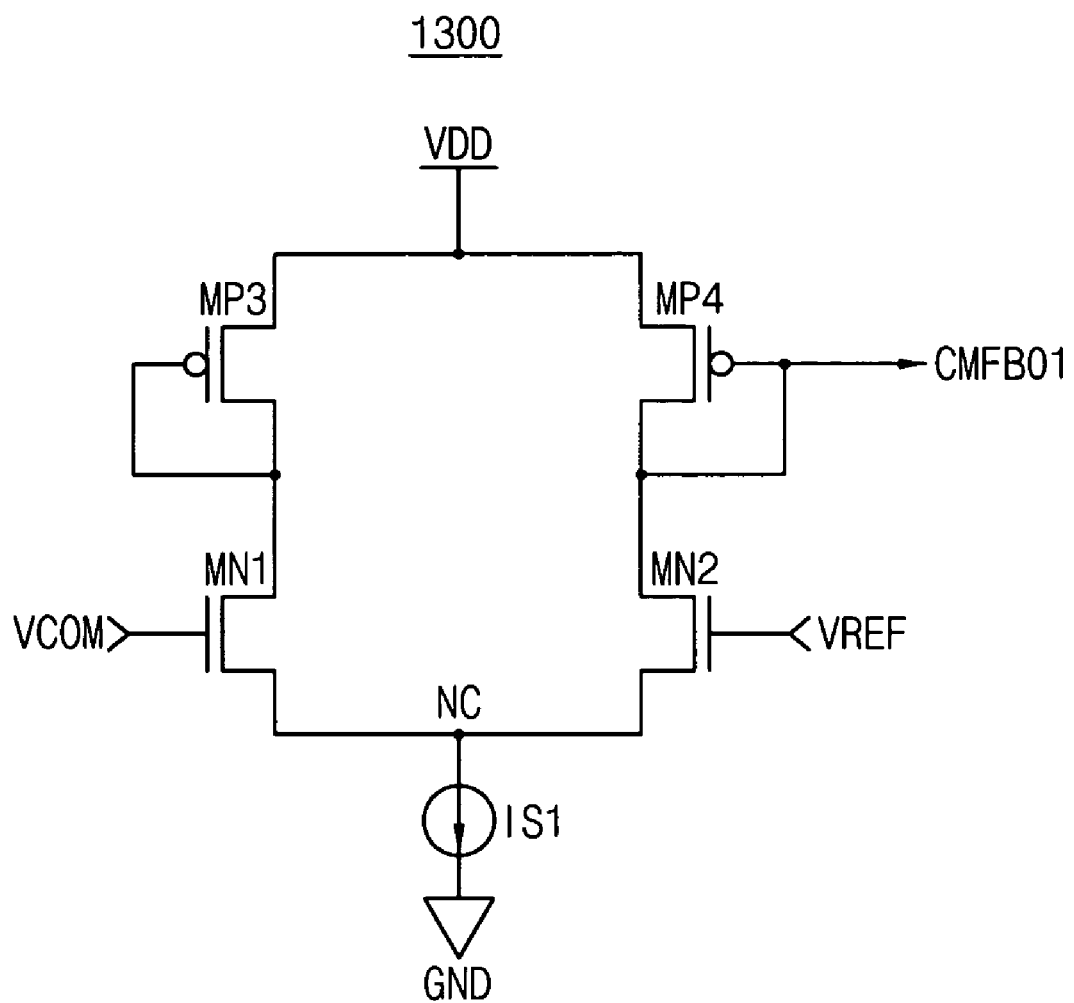
FIG. 3 is a circuit diagram illustrating a common-mode feedback circuit according to another example embodiment of the present invention.

FIG. 3 is a circuit diagram illustrating the first common-mode feedback circuit 1300 of FIG. 2 according to another example embodiment of the present invention.

In the example embodiment of FIG. 3, the first common-mode feedback circuit 1300 may include a first PMOS transistor MP3, a second PMOS transistor MP4, a first NMOS transistor MN1, a second NMOS transistor MN2 and a current source IS1.

In the example embodiment of FIG. 3, the first PMOS transistor MP3 may have a source coupled to a power voltage VDD. The second PMOS transistor MP4 may have a source coupled to the power voltage VDD, a drain outputting the common-mode feedback voltage CMFB01 and a gate coupled to the drain.

In the example embodiment of FIG. 3, the first NMOS MN1 may have a drain commonly coupled to the gate and the drain of the first PMOS transistor MP3 and a gate receiving the common-mode voltage VCOM. The second NMOS transistor MN2 may have a drain coupled to the drain of the second PMOS transistor MP4 and a gate receiving a reference voltage VREF.

In the example embodiment of FIG. 3, the current source IS1 may be coupled between a common node NC and a ground voltage GND. The common node NC may be commonly coupled to the source of the first NMOS transistor MN1 and the source of the second NMOS transistor MN2.

Hereinafter, example operations of the first common-mode feedback circuit 1300 of FIG. 3 will be explained in greater detail.

In example operation of the first common-mode feedback circuit 1300 of FIG. 3, the common-mode voltage VCOM may be generated at the common-mode voltage generator 1200 of FIG. 2. The common-mode voltage VCOM may vary based on a common-mode component of the differential output signals VOP and VON.

In example operation of the first common-mode feedback circuit 1300 of FIG. 3, if the common-mode voltage VCOM rises above the reference voltage VREF, the common-mode feedback voltage CMFB01 may increase. Likewise, if the common-mode voltage VCOM falls below the reference voltage VREF, the common-mode feedback voltage CMFB01 may decrease.

In example operation of the first common-mode feedback circuit 1300 of FIG. 3, if the common-mode feedback voltage CMFB01 is increased, a current received from the current supply circuit 1100 may decrease. Thereby, voltage levels of the differential output signals VOP and VON may likewise decrease. Thus, the common-mode voltage VCOM may be negatively fed back by the first common-mode feedback circuit 1300.

Figure 4:
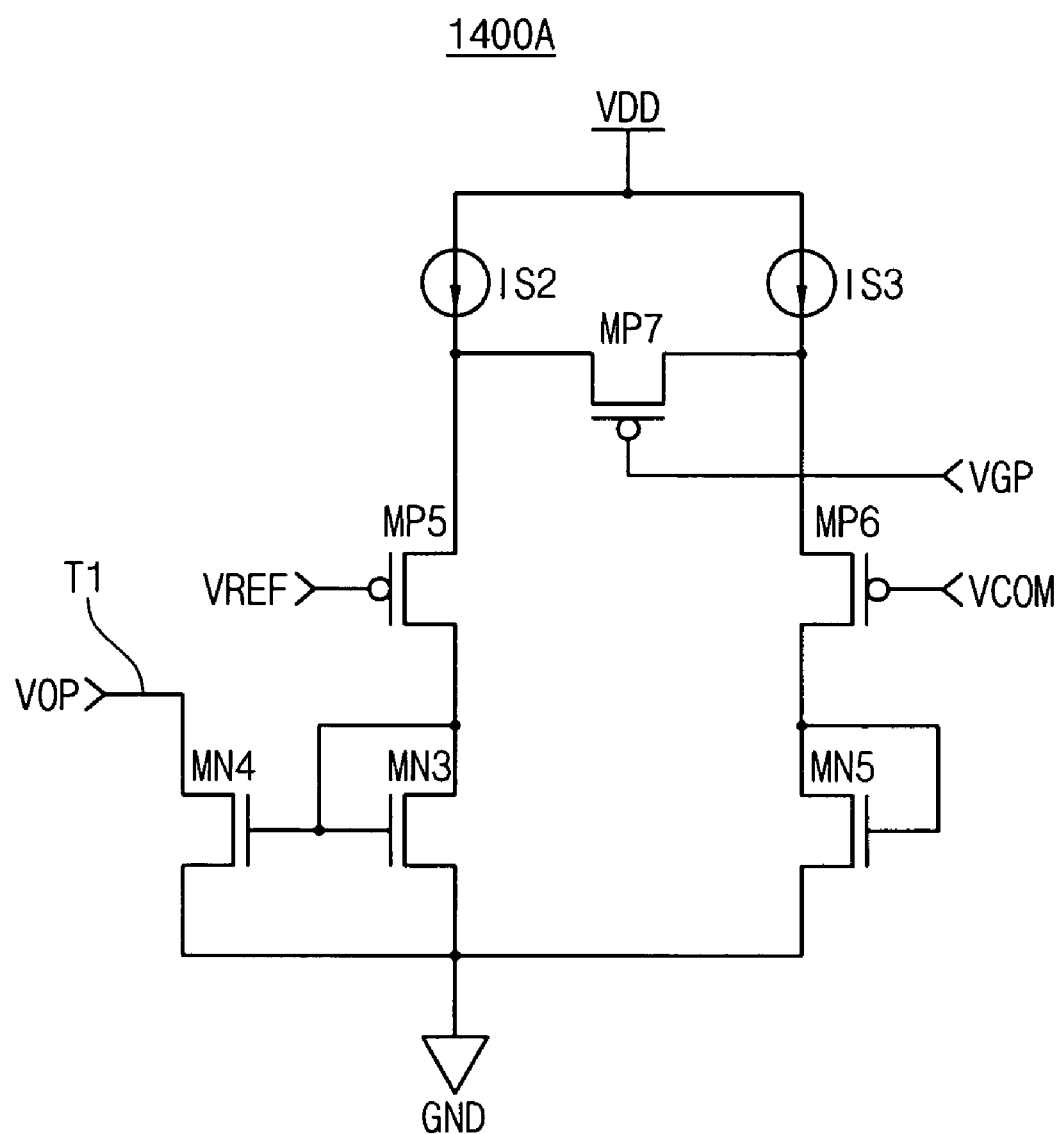
FIG. 4 is a circuit diagram illustrating a common-mode feedback circuit according to another example embodiment of the present invention.

FIG. 4 is a circuit diagram illustrating a common-mode feedback circuit 1400A according to another example embodiment of the present invention. In an example, the common-mode feedback circuit 1400A may be representative of the second common-mode feedback circuit 1400 of FIG. 2.

In the example embodiment of FIG. 4, the common-mode feedback circuit 1400A may include a first current source IS2, a second current source IS3, a first PMOS transistor MP5, a second PMOS transistor MP6, a third PMOS transistor MP7, a first NMOS transistor MN3, a second NMOS transistor MN4 and a third NMOS transistor MN5.

In the example embodiment of FIG. 4, the first current source IS2 may have a first terminal coupled to the power voltage VDD. The first PMOS transistor MP5 may have a source coupled to a second terminal of the first current source IS2 and a gate receiving the reference voltage VREF. The second current source IS3 may have a first terminal coupled to the power voltage VDD. The second PMOS transistor MP6 may have a source coupled to a second terminal of the second current source IS3 and a gate receiving the common-mode voltage VCOM.

In the example embodiment of FIG. 4, the first NMOS transistor MN3 may have a drain and a gate commonly coupled to the drain of the first PMOS transistor MP5 and a source coupled to the ground voltage GND. The second NMOS transistor MN4 may have a gate coupled to the gate of the first NMOS transistor MN3, a source coupled to the ground voltage GND and a drain coupled to the first terminal T1 of the output port 6. A voltage of the first terminal of the output port 6 may be the differential voltage VOP. The third NMOS transistor MN5 may have a drain and a gate commonly coupled to the drain of the second PMOS transistor MP6 and a source coupled to the ground voltage GND.

In the example embodiment of FIG. 4, the third PMOS transistor MP7 may be coupled between a second terminal of the first current source IS2 and a second terminal of the second current source IS3. The third PMOS transistor MP7 may have a resistance which may vary in response to the gate control signal VGP.

Hereinafter, example operations of the second common-mode feedback circuit 1400A of FIG. 4 will be described in greater detail with reference to FIG. 2.

In example operation of the common-mode feedback circuit 1400A of FIG. 4, the common-mode voltage VCOM may be generated at the common-mode voltage generator 1200 of FIG. 2. The common-mode voltage VCOM may vary based on the common-mode component of the differential output signals VOP and VON.

In example operation of the common-mode feedback circuit 1400A of FIG. 4, if the common-mode voltage VCOM rises above the reference voltage VREF, a current flowing through the second PMOS transistor MP6 may decrease and a current flowing through the first PMOS transistor MP5 may increase. A current flowing through the first NMOS transistor MN3 and the second NMOS transistor MN4 may thereby increase. Thus, the differential output voltage VOP at the first terminal of the output port 6 coupled to the mixer 10 may decrease.

In example operation of the common-mode feedback circuit 1400A of FIG. 4, if the common-mode voltage VCOM falls below the reference voltage VREF, the current flowing through the second PMOS transistor MP6 may increase and the current flowing through the first PMOS transistor MP5 may decrease. A current flowing through the first NMOS transistor MN3 and the second NMOS transistor MN4 may thereby decrease. Thus, the differential output voltage VOP at the first terminal of the output port 6 coupled to the mixer 10 may increase.

In the above-described example operation of the common-mode feedback circuit 1400A of FIG. 4, the common-mode feedback circuit 1400A may function as a negative feedback circuit.

Figure 5:
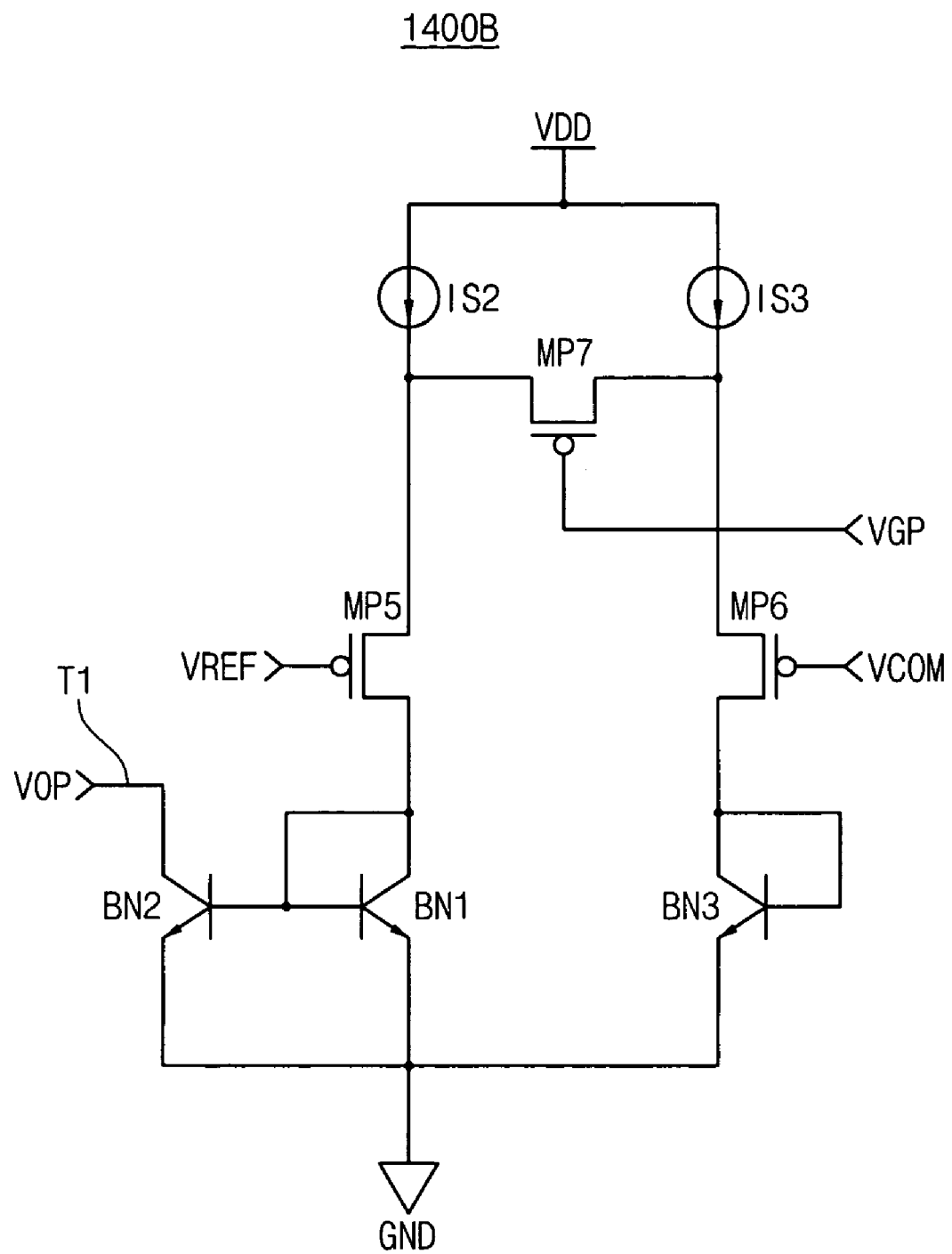
FIG. 5 is a circuit diagram illustrating a common-mode feedback circuit according to another example embodiment of the present invention.

In the example embodiment of FIG. 4, the third PMOS transistor MP7 may function as a resistor and may have a resistance value varied in response to the gate control signal VGP. In an example, the third PMOS transistor MP7 may operate in a triode region. A loop gain of the common-mode feedback circuit 1400A may be controlled through adjustments to the resistance value of the PMOS transistor MP7. The resistance value of the PMOS transistor MP7 may be adjusted through a control of the gate control signal VGP, FIG. 5 is a circuit diagram illustrating a common-mode feedback circuit 1400B according to another example embodiment of the present invention. In an example, the common-mode feedback circuit 1400B may be representative of the common-mode feedback circuit 1400 of FIG. 2.

In the example embodiment of FIG. 5, the NMOS transistors MN3, MN4 and MN5 of the common-mode feedback circuit 1400A of FIG. 4 may be replaced with NPN transistors BN1, BN2 and BN3, respectively, in the second common-mode feedback circuit 1400B of FIG. 5.

In the example embodiment of FIG. 5, the common-mode feedback circuit 1400B may include a first current source IS, a second current source IS3, a first PMOS transistor MP5, a second PMOS transistor MP6, a third PMOS transistor MP7, a first NPN transistor BN1, a second NPN transistor BN2 and a third NPN transistor BN3.

In the example embodiment of FIG. 5, the first current source IS2 may have a first terminal coupled to the power voltage VDD. The first PMOS transistor MP5 may have a source coupled to a second terminal of the first current source IS2 and a gate receiving the reference voltage VREF. The second current source IS3 may have a first terminal coupled to the power voltage VDD. The second PMOS transistor MP6 may have a source coupled to a second terminal of the second current source IS3 and a gate receiving the common-mode voltage VCOM.

In the example embodiment of FIG. 5, the first NPN transistor BN1 may have a collector and a base commonly coupled to the drain of the first PMOS transistor MP5 and an emitter coupled to the ground voltage GND. The second NPN transistor BN2 may have a base coupled to the base of the first NPN transistor BN1, an emitter coupled to the ground voltage GND and a collector coupled to the first terminal of the output port 6. A voltage of the first terminal of the output port 6 may be the differential voltage VOP.

In the example embodiment of FIG. 5, the third NPN transistor BN3 may have a collector and a base commonly coupled to the drain of the second PMOS transistor MP6 and an emitter coupled to the ground voltage GND. The third PMOS transistor MP7 may be coupled between a second terminal of the first current source IS2 and a second terminal of the second current source IS3 and may have a resistance value which may vary in response to the gate voltage signal VGP.

In the example embodiment of FIG. 5, the elements included in the common-mode feedback circuit 1400B of FIG. 5 may be similar to those elements included in and above-described with respect to the common-mode feedback circuit 1400A of FIG. 4 except for the replacement of the NMOS transistors MN3, MN4 and MN5 with the NPN transistors BN1, BN2 and BN3. Therefore, example operations of the common-mode feedback circuit 1400B of FIG. 5 will not be discussed further for the sake of brevity.

Hereinafter, example operations of the IP2 calibration circuit 200 will be described in greater detail with respect to FIGS. 2 through 5.

In example operation of the IP2 calibration circuit 200 of FIG. 2 and with reference to FIGS. 3-5, the common-mode voltage generator 1200 may generate the common-mode voltage VCOM based on variations of the terminals T1 and T2 of the output port 6. The common-mode voltage VCOM may be negatively fed back by the first common-mode feedback circuit 1300 and voltage levels at the terminals T1 and T2 of the output port 6 may be stabilized. As the common-mode voltage VCOM is fed back to the second common-mode feedback circuit 1400 (e.g., common-mode feedback circuit 1400A of FIG. 4, common-mode feedback circuit 1400B of FIG. 5, etc.) as the negative feedback voltage, the differential voltage VOP of the first terminal T1 may be controlled.

In example operation of the IP2 calibration circuit 200 of FIG. 2 and with reference to FIGS. 3-5, the second common-mode feedback circuit 1400 (e.g., common-mode feedback circuit 1400A of FIG. 4, common-mode feedback circuit 1400B of FIG. 5, etc.) may have a gain which may vary in response to the gate control signal VGP. The second common-mode feedback circuit 1400 may control an impedance of the first terminal T1 of the output port 6. In an example, the gate control signal VGP may be a second order Intermodulation (IM2) calibration signal.

Accordingly, the IP2 calibration circuit 200 according to the above-described example operation may reduce (e.g., minimize) an output voltage of the IM2 and may increase (e.g., maximize) the IP2 by controlling the gain of the common-mode feedback circuit which may thereby control the impedance of the output terminal of the mixer 10.

Figure 6:
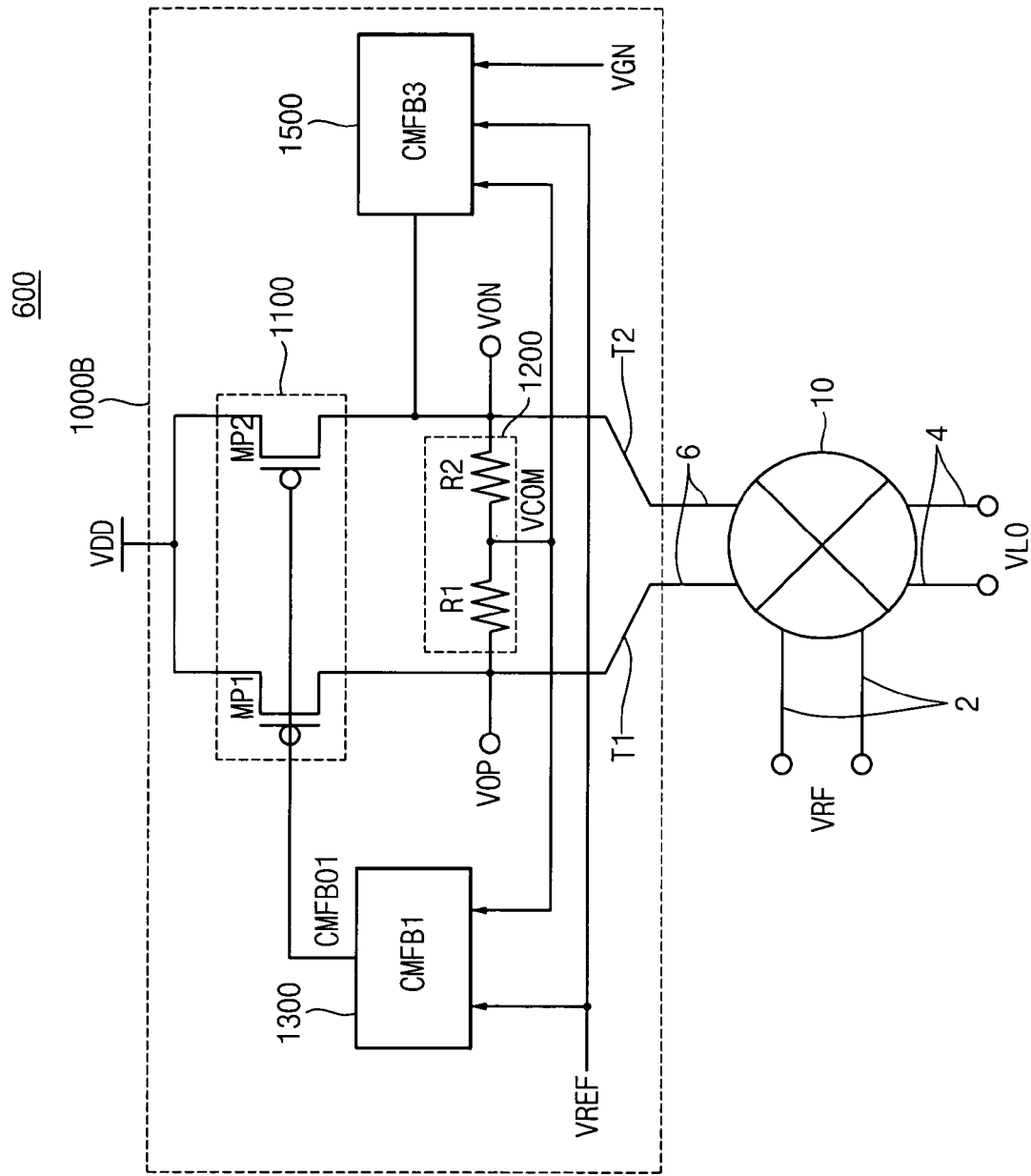
FIG. 6 is a circuit diagram illustrating an IP2 calibration circuit according to another example embodiment of the present invention.

FIG. 6 is a circuit diagram illustrating an IP2 calibration circuit 600 according to another example embodiment of the present invention.

In the example embodiment of FIG. 6, the IP2 calibration circuit 600 may include a third common-mode feedback circuit 1500 having an output terminal coupled to the second terminal T2 of the output port 6 (e.g., which may differ from the IP2 calibration circuit 200 of FIG. 2 having the second common-mode feedback circuit 1400 with an output terminal coupled to the first terminal T1 of the output port 6).

In the example embodiment of FIG. 6, the IP2 calibration circuit 600 may include a mixer 10 and an IP2 controller 1000B. The IP2 controller 1000B may include the first common-mode feedback circuit 1300 (e.g., above-described with respect to FIG. 2), the third common-mode feedback circuit 1500, the current supply circuit 1100 and the common-mode voltage generator 1200. As described with respect to FIG. 2, the current supply circuit 1100 may include a first PMOS transistor MP1 and a second PMOS transistor MP2, the common-mode voltage generator 1200 may include a first resistor R1 and a second resistor R2, and the mixer 10 may convert a radio frequency input signal having a carrier frequency to a base-band signal.

In the example embodiment of FIG. 6, the first common-mode feedback circuit 1300 may detect the common-mode voltage VCOM of the output port 6 coupled to the mixer 10 to receive the VCOM as a negative feedback voltage through an inverted input of the first common-mode feedback circuit 1300. The first common-mode feedback circuit 1300 may generate the common-mode feedback voltage CMFB01.

In the example embodiment of FIG. 6, the third common-mode feedback circuit 1500 may detect the common-mode voltage VCOM of the output port 6 coupled to the mixer 10 to determine a loop gain which may vary in response to a gate control signal VGN. Further, the third common-mode feedback circuit 1500 may adjust or vary an impedance of a second terminal T2 of the output port 6.

In the example embodiment of FIG. 6, the current supply circuit 1100 may generate a current and output the generated current to the output port 6 coupled to the mixer 10 in response to the common-mode feedback voltage CMFB01.

In the example embodiment of FIG. 6, the common-mode voltage generator 1200 may receive the first output signal VOP from the first terminal T1 of the output port 6 and may receive the second output signal VON from a second terminal T2 of the output port 6 to generate the common-mode voltage VCOM. In an example, output signals of the mixer 10 may be differential signals.

In the example embodiment of FIG. 6, the common-mode voltage generator 1200 may receive the differential output signals VOP and VON to generate the common-mode voltage VCOM at a connection point of the first resistor R1 and the second resistor R2.

Figure 7:
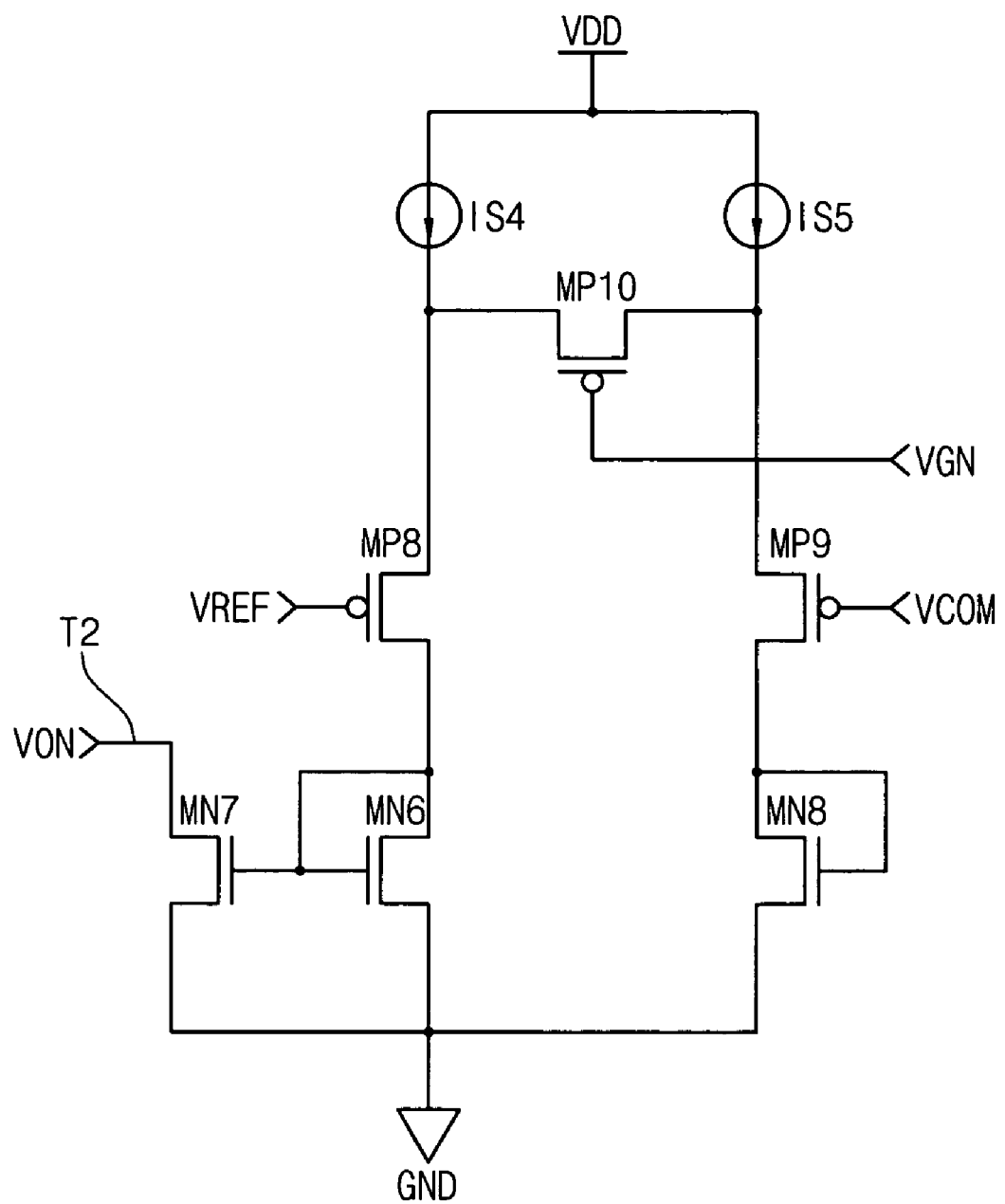
FIG. 7 is a circuit diagram illustrating a common-mode feedback circuit according to another example embodiment of the present invention.

FIG. 7 is a circuit diagram illustrating a common-mode feedback circuit 1500A according to another example embodiment of the present invention. In an example, the common-mode feedback circuit 1500A may be representative of the third common-mode feedback circuit 1500 of FIG. 6.

In the example embodiment of FIG. 7, the common-mode feedback circuit 1500A may include a first current source IS4, a second current source IS5, a first PMOS transistor MP8, a second PMOS transistor MP9, a third PMOS transistor MP10, a first NMOS transistor MN6, a second NMOS transistor MN7 and a third NMOS transistor MN8.

In the example embodiment of FIG. 7, the first current source IS4 may have a first terminal coupled to the power voltage VDD. The first PMOS transistor MP8 may have a source coupled to a second terminal of the first current source IS4 and a gate receiving the reference voltage VREF. The second current source IS5 may have a first terminal coupled to the power voltage VDD. The second PMOS transistor MP9 may have a source coupled to a second terminal of the second current source IS5 and a gate receiving the common-mode voltage VCOM.

In the example embodiment of FIG. 7, the first NMOS transistor MN6 may have a drain and a gate commonly coupled to the drain of the first PMOS transistor MP8 and a source coupled to the ground voltage GND. The second NMOS transistor MN7 may have a gate coupled to the gate of the first NMOS transistor MN6, a source coupled to the ground voltage GND and a drain coupled to the second terminal T2 of the output port 6. A voltage of the second terminal of the output port 6 may be the differential voltage VON.

In the example embodiment of FIG. 7, the third NMOS transistor MN8 may have a drain and a gate commonly coupled to the drain of the second PMOS transistor MP9 and a source coupled to the ground voltage GND. The third PMOS transistor MP10 may be coupled between a second terminal of the first current source IS4 and a second terminal of the second current source IS5 and may have a resistance value which may vary in response to the gate control signal VGN.

In the example embodiment of FIG. 7, the common-mode feedback circuit 1500A of FIG. 7 may have a configuration identical to that of the common-mode feedback circuit 1400A of FIG. 4 except that the output terminal of the common-mode feedback circuit 1500A may be coupled to the second terminal T2 of the output port 6 (e.g., instead of the first terminal T1).

In the example embodiment of FIG. 7, since the drain of the second NMOS transistor MN7 may be coupled to the second terminal T2 of the output port 6 which may thereby be coupled to the mixer 10, a gain of the common-mode feedback circuit 1500A may be controlled based on the gate control signal VGN, which may adjust an impedance of the second terminal T2 of the output port 6.

Figure 8:
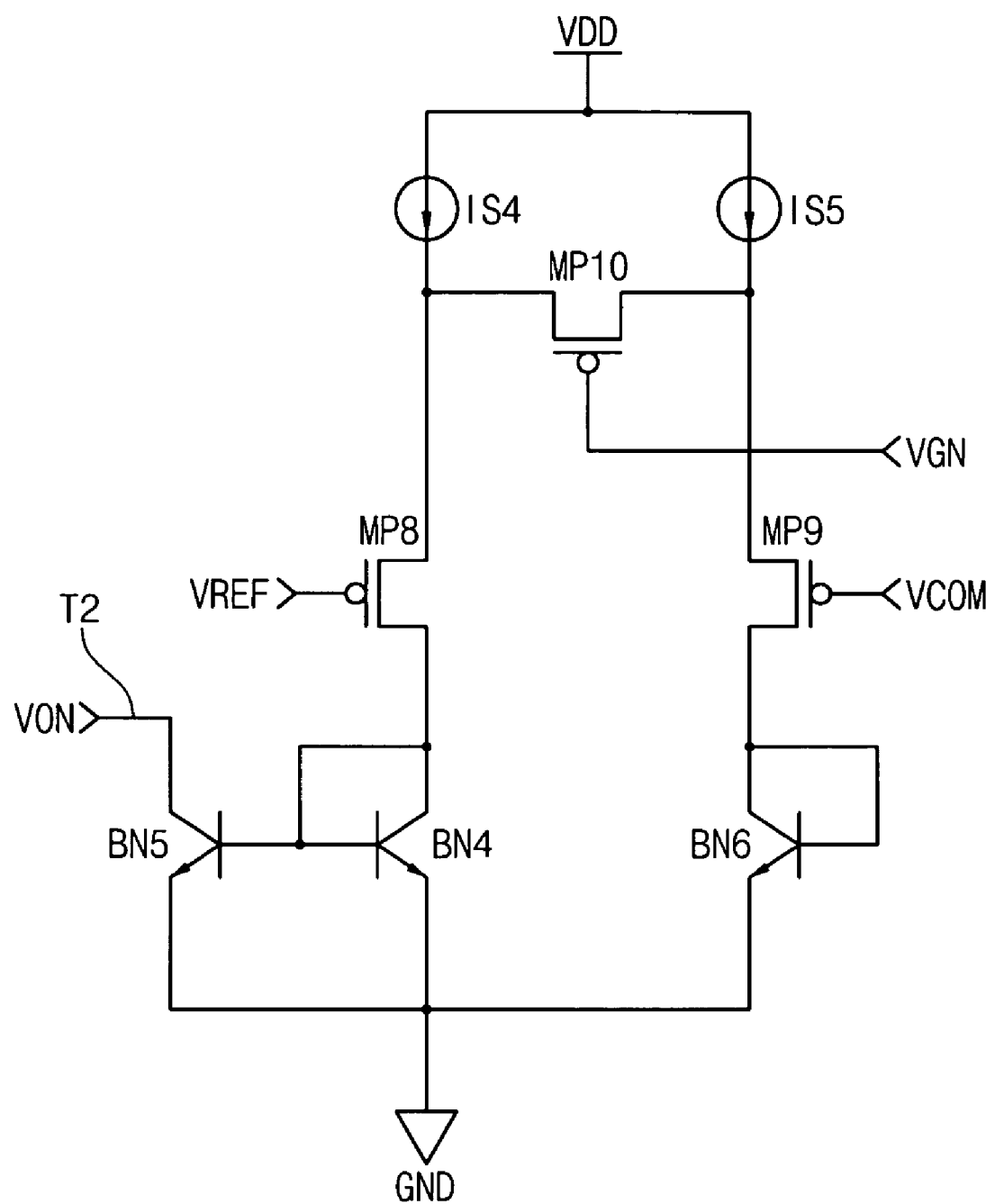
FIG. 8 is a circuit diagram illustrating a common-mode feedback circuit according to another example embodiment of the present invention.

FIG. 8 is a circuit diagram illustrating a common-mode feedback circuit 1500B according to another example embodiment of the present invention. In an example, the common-mode feedback circuit 1500B may be representative of the third common-mode feedback circuit 1500 of FIG. 6.

In the example embodiment of FIG. 8, the NMOS transistors MN6, MN7 and MN8 included in the common-mode feedback circuit 1500A of FIG. 7 may be replaced with NPN transistors BN4, BN5 and BN6 in the common-mode feedback circuit 1500B of FIG. 8.

In the example embodiment of FIG. 8, the common-mode feedback circuit 1500B may include a first current source IS4, a second current source IS5, a first PMOS transistor MP8, a second PMOS transistor MP9, a third PMOS transistor MP10, and a first NPN transistor BN4, a second NPN transistor BN5 and a third NPN transistor BN6.

In the example embodiment of FIG. 8, the first current source IS4 may have a first terminal coupled to the power voltage VDD. The first PMOS transistor MP8 may have a source coupled to a second terminal of the first current source IS4 and a gate receiving the reference voltage VREF. The second current source IS5 may have a first terminal coupled to the power voltage VDD. The second PMOS transistor MP9 may have a source coupled to a second terminal of the second current source IS5 and a gate receiving the common-mode voltage VCOM.

In the example embodiment of FIG. 8, the first NPN transistor BN4 may have a collector and a base commonly coupled to the drain of the first PMOS transistor MP8 and an emitter coupled to the ground voltage GND. The second NPN transistor BN5 may have a base coupled to the base of the first NPN transistor BN4, an emitter coupled to the ground voltage GND and a collector coupled to the second terminal T2 of the output port 6. A voltage of the second terminal T2 of the output port 6 may be the differential voltage VON.

In the example embodiment of FIG. 8, the third NPN transistor BN6 may have a collector and a base commonly coupled to the drain of the second PMOS transistor MP9 and an emitter coupled to the ground voltage GND. The third PMOS transistor MP10 may be coupled between a second terminal of the first current source IS4 and a second terminal of the second current source IS5, and may have a resistance value which may vary in response to the gate voltage signal VGN.

In the example embodiment of FIGS. 7 and 8, the elements included in the common-mode feedback circuit 1500B of FIG. 8 may be similar with respect to those elements included in the common-mode feedback circuit 1500A of FIG. 7 except for the replacement of the NMOS transistors MN6, MN7 and MN8 with the NPN transistors BN4, BN5 and BN6, respectively. As such, a further description of example operations of the common-mode feedback circuit 1500B of FIG. 8 will be omitted for the sake of brevity.

Hereinafter, example operations of the IP2 calibration circuit 600 of FIG. 6 will be described with respect to FIGS. 6 through 8.

In example operation of the IP2 calibration circuit 600 of FIG. 6 and with reference to FIGS. 7 and 8, the IP2 calibration circuit 600 of FIG. 6 may be configured as the IP2 calibration circuit 200 of FIG. 2 except for the configuration of the third common-mode feedback circuit 1500 (e.g., common-mode feedback circuit 1500A of FIG. 7, common-mode feedback circuit 1500B of FIG. 8, etc.)

In example operation of the IP2 calibration circuit 600 of FIG. 6 and with reference to FIGS. 7 and 8, the IP2 calibration circuit 600 may apply the gate control signal VGN to control an impedance of the second terminal T2 of the output port 6. The gate control signal VGN may be an IM2 calibration signal. The IP2 calibration circuit 600 may reduce (e.g., minimize) an output voltage of the IM2 and may increase (e.g., maximize) the IP2 by controlling the gain of the common-mode feedback circuit (e.g., common-mode feedback circuit 1500A of FIG. 7, common-mode feedback circuit 1500B of FIG. 8, etc.), thereby controlling an impedance of the output terminal of the mixer 10.

Figure 9:
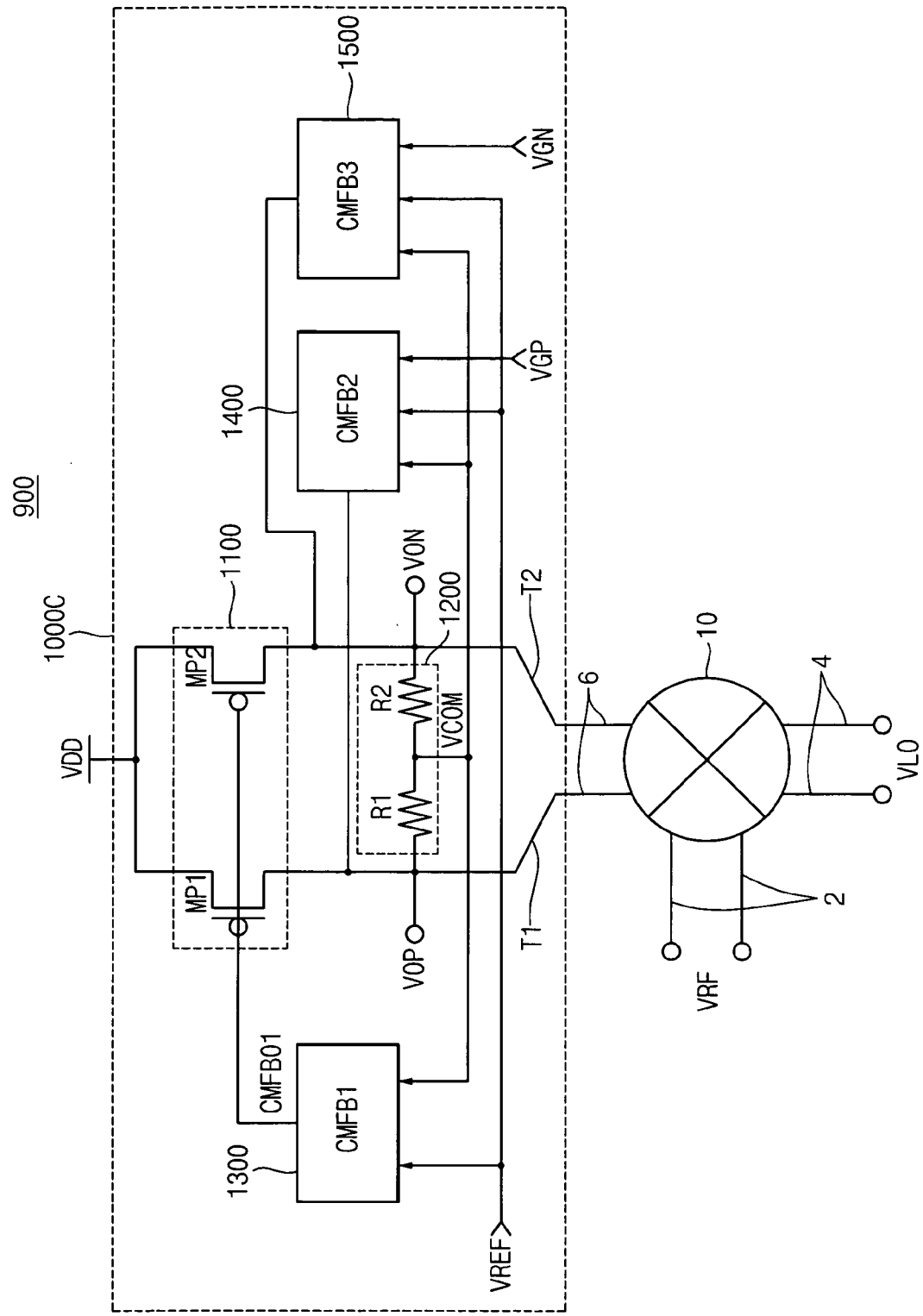
FIG. 9 is a circuit diagram illustrating an IP2 calibration circuit according to another example embodiment of the present invention.

FIG. 9 is a circuit diagram illustrating an IP2 calibration circuit 900 according to another example embodiment of the present invention.

In the example embodiment of FIG. 9, the IP2 calibration circuit 900 may include the second common-mode feedback circuit 1400 (e.g., common-mode feedback circuit 1400A of FIG. 4, common-mode feedback circuit 1400B of FIG. 5, etc.) having an output terminal coupled to the first terminal T1 of the output port 6 and the third common-mode feedback circuit 1500 (e.g., common-mode feedback circuit 1500A of FIG. 7, common-mode feedback circuit 1500B of FIG. 8) having an output terminal coupled to the second terminal T2 of the output port 6 and the first common-mode feedback circuit 1300.

In the example embodiment of FIG. 9, the IP2 calibration circuit 600 may include the mixer 10 and an IP2 controller 1000C. The IP2 controller 1000C may include the first common-mode feedback circuit 1300, the second common-mode feedback circuit 1400, the third common-mode feedback circuit 1500, the current supply circuit 1100 and the common-mode voltage generator 1200. The current supply circuit 1100 may include a first PMOS transistor MP1 and a second PMOS transistor MP2. The common-mode voltage generator 1200 may include a first resistor R1 and a second resistor R2. The mixer 10 may convert a radio frequency input signal having a carrier frequency to a base-band signal.

In the example embodiment of FIG. 9, the first common-mode feedback circuit 1300 may detect the common-mode voltage VCOM of the output port 6 coupled to the mixer 10 to receive the VCOM as a negative feedback voltage through an inverted input of the first common-mode feedback circuit 1300. The first common-mode feedback circuit 1300 may generate the common-mode feedback voltage CMFB01.

In the example embodiment of FIG. 9, the second common-mode feedback circuit 1400 may detect the common-mode voltage VCOM of the output port 6 coupled to the mixer 10 to determine a loop gain which may vary in response to a first gate control signal VGP. The second common-mode feedback circuit 1400 may also vary an impedance of the second terminal T2 of the output port 6.

In the example embodiment of FIG. 9, the third common-mode feedback circuit 1500 may detect the common-mode voltage VCOM of the output port 6 to determine a loop gain which may vary in response to a second gate control signal VGN. The third common-mode feedback circuit 1500 may vary an impedance of the second terminal T2 of the output port 6.

In the example embodiment of FIG. 9, the current supply circuit 1100 may generate a current and may output the generated current to the output port 6 coupled to the mixer 10 in response to the common-mode feedback voltage CMFB01. The common-mode voltage generator 1200 may receive a first output signal VOP from the first terminal T1 of the output port 6 and may receive a second output signal VON from the second terminal T2 of the output port 6 to generate the common-mode voltage VCOM. In an example, output signals of the mixer 10 may be differential signals.

In the example embodiment of FIG. 9, the common-mode voltage generator 1200 may receive the differential output signals VOP and VON to generate the common-mode voltage VCOM at a connection point of the first resistor R1 and the second resistor R2.

Hereinafter, example operations of the IP2 calibration circuit 900 of FIG. 9 will be described in greater detail.

In example operation of the IP2 calibration circuit 900 of FIG. 9, the IP2 calibration circuit 900 may include the second common-mode feedback circuit 1400, as may be present in the IP2 calibration circuit 200 of FIG. 2, and the third common-mode feedback circuit 1500, as may be present in the IP2 calibration circuit 600 of FIG. 6.

In example operation of the IP2 calibration circuit 900 of FIG. 9, the second common-mode feedback circuit 1400 may control the loop gain based on the first gate control signal VGP and may vary the impedance of the first output terminal T1 of the output port 6. The third common-mode feedback circuit 1500 may control the loop gain based on the second gate control signal VGN and may vary the impedance of the second output terminal T2 of the output port 6. The first and second gate control signals may be IM2 calibration signals.

In example operation of the IP2 calibration circuit 900 of FIG. 9, the IP2 calibration circuit 900 may thereby reduce (e.g., minimize) an output voltage of the IM2 and may increase (e.g., maximize) the IP2 by controlling the gain of at least one common-mode feedback circuit which may thereby control an impedance of the output terminal of the mixer 10.

Figure 10:
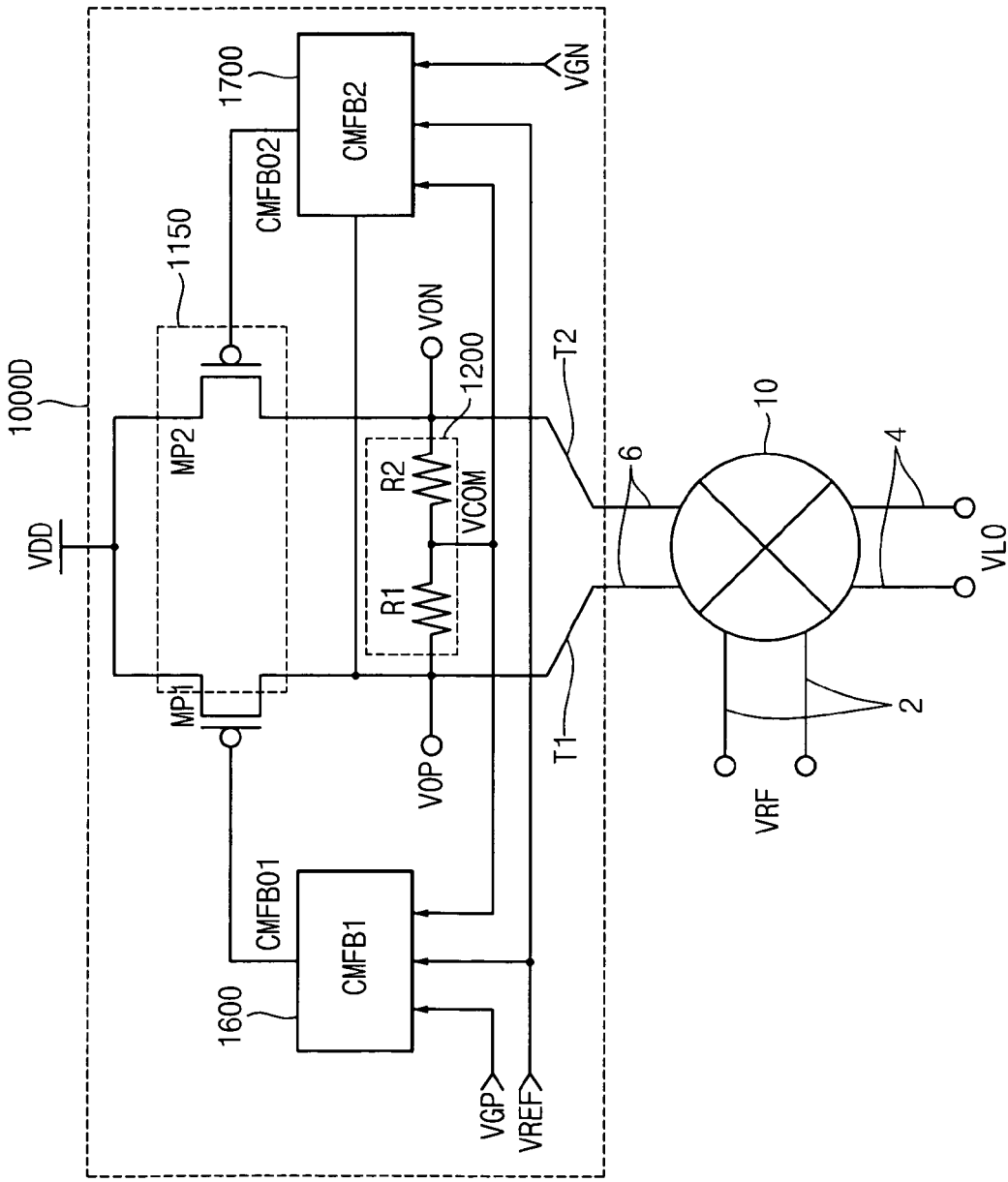
FIG. 10 is a circuit diagram illustrating an IP2 calibration circuit according to another example embodiment of the present invention.

FIG. 10 is a circuit diagram illustrating an IP2 calibration circuit 1050 according to another example embodiment of the present invention.

In the example embodiment of FIG. 10, the IP2 calibration circuit 1060 may include the mixer 10 and an IP2 controller 1000D. The IP2 controller 1000D may include a first common-mode feedback circuit 1600, a second common-mode feedback circuit 1700, a current supply circuit 1150 and a common-mode voltage generator 1200. The current supply circuit 1150 may include a first PMOS transistor MP1 and a second PMOS transistor MP2. The common-mode voltage generator 1200 may include a first resistor R1 and a second resistor R2. The mixer 10 may convert a radio frequency input signal having a carrier frequency to a base-band signal.

In the example embodiment of FIG. 10, the first common-mode feedback circuit 1600 may detect a common-mode voltage VCOM of an output port 6 coupled to the mixer 10 to receive the VCOM as a negative feedback voltage through an inverted input of the first common-mode feedback circuit 1600. The first common-mode feedback circuit 1600 may include a loop gain which may vary in response to a first gate control signal VGP and may generate a first common-mode feedback voltage CMFB01.

In the example embodiment of FIG. 10, the second common-mode feedback circuit 1700 may detect the common-mode voltage VCOM of the output port 6 coupled to the mixer 10 to receive the VCOM as a negative feedback voltage through an inverted input of the second common-mode feedback circuit 1700. The second common-mode feedback circuit 1700 may include a loop gain which may vary in response to a second gate control signal VGN and may generate a second common-mode feedback voltage CMFB02.

In the example embodiment of FIG. 10, the current supply circuit 1150 may generate a current and may output the generated current to the output port 6 coupled to the mixer 10 in response to the first common-mode feedback voltage CMFB01 and the second common-mode feedback voltage CMFB02. The common-mode voltage generator 1200 may receive a first differential output signal VOP from the first terminal T1 of the output port 6 and may receive a second differential output signal VON from a second terminal T2 of the output port 6 to generate the common-mode voltage VCOM. Output signals of the mixer 10 may be differential signals.

In the example embodiment of FIG. 10, the common-mode voltage generator 1200 may receive the differential output signals VOP and VON to generate the common-mode voltage VCOM at a connection point of the first resistor R1 and the second resistor R2.

Figure 11:
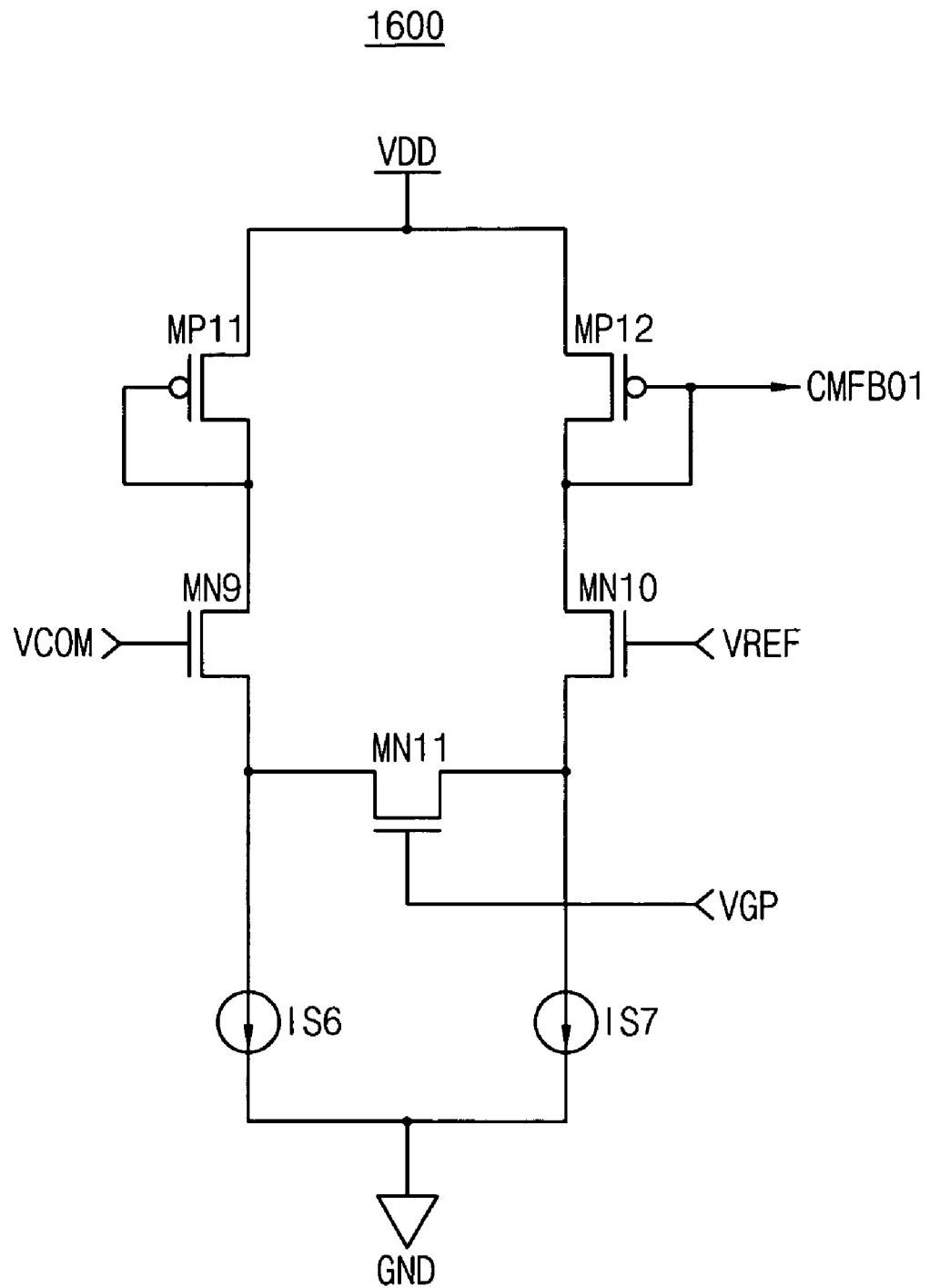
FIG. 11 is a circuit diagram illustrating a common-mode feedback circuit according to another example embodiment of the present invention.

FIG. 11 is a circuit diagram illustrating the first common-mode feedback circuit 1600 of FIG. 10 according to another example embodiment of the present invention.

In the example embodiment of FIG. 11, the common-mode feedback circuit 1600 may include a first PMOS transistor MP11, a second PMOS transistor MP12, a first NMOS transistor MN9, a second NMOS transistor MN10, a third NMOS transistor MN11, a first current source IS6 and a second current source IS7.

In the example embodiment of FIG. 11, the first PMOS transistor MP11 may have a source coupled to the power voltage VDD. The second PMOS transistor MP12 may have a source coupled to the power voltage VDD, a drain outputting a first common-mode feedback voltage CMFB01 and a gate coupled to the drain.

In the example embodiment of FIG. 11, the first NMOS transistor MN9 may have a drain commonly coupled to the gate and the drain of the first PMOS transistor MP11 and a gate receiving the common-mode voltage. The second NMOS transistor MN10 may have a drain coupled to the drain of the second PMOS transistor MP12 and a gate receiving the reference voltage VREF.

In the example embodiment of FIG. 11, the first current source IS6 may be coupled between the source of the first NMOS transistor MN9 and the ground voltage GND. The second current source IS7 may be coupled between the source of the second NMOS transistor MN10 and the ground voltage GND.

In the example embodiment of FIG. 11, the third NMOS transistor MN11 may be coupled between the source of the first NMOS transistor MN9 and the source of the second NMOS transistor MN10. The third NMOS transistor MN11 may have a resistance value which may vary in response to a first gate control signal VGP.

Hereinafter, example operations of the first common-mode feedback circuit 1600 of FIG. 11 will be described in greater detail.

In example operation of the first common-mode feedback circuit 1600 of FIG. 11, the common-mode voltage VCOM may be generated by the common-mode voltage generator 1200 of FIG. 10. The common-mode voltage VCOM may vary based on a common-mode component of the differential output signals VOP and VON.

In example operation of the first common-mode feedback circuit 1600 of FIG. 11, if the common-mode voltage VCOM rises above the reference voltage VREF, a current flowing through the first NMOS transistor MN9 may increase and a current flowing through the second NMOS transistor MN10 may decrease. Accordingly, the common-mode feedback voltage CMFB01 may increase.

In example operation of the first common-mode feedback circuit 1600 of FIG. 11, if the common-mode voltage VCOM falls below the reference voltage VREF, the current flowing through the first NMOS transistor MN9 may decrease and the current flowing through the second NMOS transistor MN10 may increase. Accordingly, the common-mode feedback voltage CMFB01 may decrease.

In example operation of the first common-mode feedback circuit 1600 of FIG. 11, if the common-mode feedback voltage CMFB01 increases, a current output from the current supply circuit 1150 of FIG. 10 may decrease. Accordingly, the voltage of the first terminal T1 of the output port 6 coupled to the mixer 10 may decrease.

In example operation of the first common-mode feedback circuit 1600 of FIG. 11, if the common-mode feedback voltage CMFB01 decreases, the current output from the current supply circuit 1150 of FIG. 10 may increase. Accordingly, the voltage of the first terminal T1 of the output port 6 coupled to the mixer 10 may increase. The common-mode voltage VCOM may thereby be fed back to the inverted input of the first common-mode feedback circuit 1600.

In example operation of the first common-mode feedback circuit 1600 of FIG. 11, the third NMOS transistor MN11 may function as a resistor and may have a resistance value which may vary in response to the first gate control signal VGP. In an example, the third NMOS transistor MN11 may operate in a triode region. The resistance value of the third NMOS transistor MN11 may vary based on the first control signal VGP, which may thereby control the loop gain of the first common-mode feedback circuit 1600.

Figure 12:
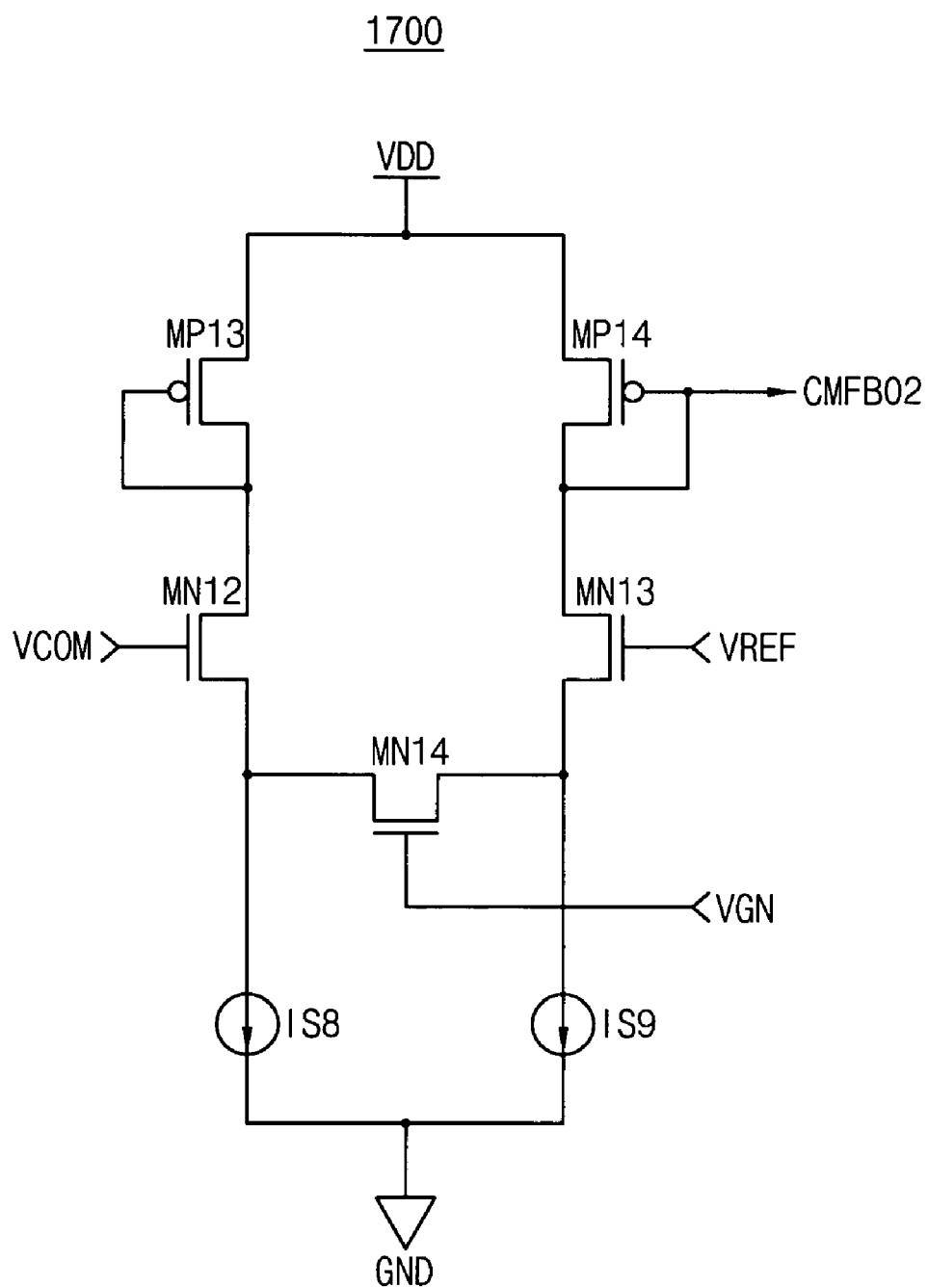
FIG. 12 is a circuit diagram illustrating a common-mode feedback circuit according to another example embodiment of the present invention.

FIG. 12 is a circuit diagram illustrating the second common-mode feedback circuit 1700 of FIG. 10 according to another example embodiment of the present invention.

In the example embodiment of FIG. 12, the second common-mode feedback circuit 1700 may include a first PMOS transistor MP13, a second PMOS transistor MP14, a first NMOS transistor MN12, a second NMOS transistor MN13, a third NMOS transistor MN14, a first current source IS8 and a second current source IS9.

In the example embodiment of FIG. 12, the first PMOS transistor MP13 may have a source coupled to the power voltage VDD. The second PMOS transistor MP14 may have a source coupled to the power voltage VDD, a drain outputting a second common-mode feedback voltage CMFB02 and a gate coupled to the drain.

In the example embodiment of FIG. 12, the first NMOS transistor MN12 may have a drain commonly coupled to the gate and the drain of the first PMOS transistor MP13 and a gate receiving the common-mode voltage VCOM. The second NMOS transistor MN13 may have a drain coupled to the drain of the second PMOS transistor MP14 and a gate receiving the reference voltage VREF.

In the example embodiment of FIG. 12, the first current source IS8 may be coupled between the drain of the first NMOS transistor MN12 and the ground voltage GND. The second current source IS9 may be coupled between the drain of the second NMOS transistor MN13 and the ground voltage GND.

In the example embodiment of FIG. 12, the third NMOS transistor MN14 may be coupled between the source of the first NMOS transistor MN12 and the source of the second NMOS transistor MN13. The third NMOS transistor MN14 may have a resistance value which may vary in response to a second gate control signal VGN.

Hereinafter, example operations of the second common-mode feedback circuit 1700 of FIG. 12 will now be described in greater detail.

In example operation of the second common-mode feedback circuit 1700 of FIG. 12, the common-mode voltage VCOM may be generated by the common-mode voltage generator 1200 of FIG. 10. The common-mode voltage VCOM may vary based on the common-mode component of the differential output signals VOP and VON.

In example operation of the second common-mode feedback circuit 1700 of FIG. 12, if the common-mode voltage VCOM rises above the reference voltage VREF, a current flowing through the first NMOS transistor MN12 may increase and a current flowing through the second NMOS transistor MN13 may decrease. Accordingly, the second common-mode feedback voltage CMFB02 may increase.

In example operation of the second common-mode feedback circuit 1700 of FIG. 12, if the common-mode voltage VCOM falls below the reference voltage VREF, the current flowing through the first NMOS transistor MN12 may decrease and the current flowing through the second NMOS transistor MN13 may increase. Accordingly, the second common-mode feedback voltage CMFB02 may decrease.

In example operation of the second common-mode feedback circuit 1700 of FIG. 12, if the second common-mode feedback voltage CMFB02 increases, a current output from the current supply circuit 1150 may decrease. Accordingly, the voltage of the first terminal T1 of the output port 6 coupled to the mixer 10 may decrease.

In example operation of the second common-mode feedback circuit 1700 of FIG. 12, if the second common-mode feedback voltage CMFB02 decreases, the current output from the current supply circuit 1150 may increase. Accordingly, the voltage of the first terminal T1 of the output port 6 coupled to the mixer 10 may increase. Thereby, the common-mode voltage VCOM may be fed back to the inverted input of the second common-mode feedback circuit 1700.

In example operation of the second common-mode feedback circuit 1700 of FIG. 12, the third NMOS transistor MN14 may function as a resistor and may have a resistance value which may vary in response to the second gate control signal VGN. In an example, the third NMOS transistor MN14 may operate in a triode region. The resistance value of the third NMOS transistor MN14 may vary based on the second control signal VGN. Thereby, the loop gain of the second common-mode feedback circuit 1700 may be controlled.

Hereinafter, example operations of the IP2 calibration circuit 1050 of FIG. 10 will be described in greater detail with reference to FIGS. 10 through 12.

In example operation of the IP2 calibration circuit 1050 of FIG. 10 with further reference to FIGS. 11 and 12, the IP2 calibration circuit 1050 may include the first common-mode feedback circuit 1600 and the second common-mode feedback circuit 1700 which may collectively be capable of controlling the loop gain. The common-mode voltage generator 1200 may generate the common-mode voltage VCOM which may vary based on variation of the voltages of the first terminal T1 and the second terminal T2.

In example operation of the IP2 calibration circuit 1050 of FIG. 10 with further reference to FIGS. 11 and 12, the common-mode voltage VCOM may be fed back to an inverted input of the first common-mode feedback circuit 1600. Accordingly, the voltage of the first terminal T1 of the output port 6 may be stabilized. The first common-mode feedback circuit 1600 may vary the loop gain in response to the first gate control signal VGP and may control the impedance of the first terminal T1 of the output port 6.

In example operation of the IP2 calibration circuit 1050 of FIG. 10 with further reference to FIGS. 11 and 12, the common-mode voltage VCOM may be fed back to an inverted input of the second common-mode feedback circuit 1700. Accordingly, the voltage of the second terminal T2 of the output port 6 may be stabilized. The second common-mode feedback circuit 1700 may vary the loop gain in response to the second gate control signal VGN and may control the impedance of the second terminal T2 of the output port 6. The first gate control signal VGP and the second gate control signal VGN of FIG. 10 may be IM2 calibration signals.

In example operation of the IP2 calibration circuit 1050 of FIG. 10 with further reference to FIGS. 11 and 12, the IP2 calibration circuit 1050 may reduce (e.g., minimize) the output voltage of the IM2 and may increase (e.g., maximize) the IP2 value by controlling the loop gain of the common-mode feedback circuits 1600 and 1700 to control an impedance of the first terminal T1 and the second terminal T2.

In another example embodiment of the present invention, an IP2 calibration circuit (e.g., IP calibration circuit 200, 600, 900, 1050, etc.) may reduce (e.g., minimize) the output voltage of the IM2 and may increase (e.g., maximize) the IP2 value by controlling the loop gain of at least one common-mode feedback circuit. Further, the IP2 calibration circuit (e.g., IP calibration circuit 200, 600, 900, 1050, etc.) may occupy a lower amount of space on a semiconductor wafer (e.g., because of the controlled impedance).

Example embodiments of the present invention being thus described, it will be obvious that the same may be varied in many ways. For example, while numerous example embodiments of calibration circuits including various combinations of common-mode feedback circuits have been described above, it is understood that calibration circuits according to other example embodiments of the present invention may include any combination of common mode feedback circuits.

Such variations are not to be regarded as departure from the spirit and scope of example embodiments of the present invention, and all such modifications as would be obvious to one skilled in the art are intended to be included within the scope of the following claims.

What is claimed is:
1. A calibration circuit, comprising:
a mixer configured to convert a radio frequency (RF) input signal into a base-band signal;
a first common-mode feedback circuit configured to detect a common-mode voltage of an output port of the mixer to negatively feedback the common-mode voltage to generate a first common-mode feedback voltage;
a current supply circuit configured to supply a current to the output port of the mixer, the current supply circuit adjusting the current in response to the first common-mode feedback voltage; and
a second common-mode feedback circuit configured to adjust a loop gain in response to a gate control signal and configured to adjust a first impedance of a first terminal of the output port of the mixer.

2. The calibration circuit of claim 1, wherein the gate control signal includes a second order Intermodulation (IM2) calibration signal.

3. The calibration circuit of claim 1, further comprising:
a common-mode voltage generator configured to generate the common-mode voltage based on a first output signal from the first terminal of the output port of the mixer and a second output signal from a second terminal of the output port of the mixer.

4. The calibration circuit of claim 3, wherein the common-mode voltage generator includes a first resistor and a second resistor serially coupled between the first terminal and the second terminal of the output port and the common-mode voltage is output at a connection point of the first resistor and the second resistor.

5. The calibration circuit of claim 1, wherein the second common-mode feedback circuit is configured to adjust the impedance of the first terminal of the output port in response to the gate control signal.

6. The calibration circuit of claim 1, wherein the first common-mode feedback circuit includes:
a first PMOS transistor having a source coupled to a first voltage;
a second PMOS transistor having a source coupled to the first voltage, a drain outputting the first common-mode feedback voltage and a gate coupled to the drain of the second PMOS transistor;
a first NMOS transistor having a drain commonly coupled to the gate and the drain of the first PMOS transistor and a gate receiving the common-mode voltage;
a second NMOS transistor having a drain coupled to the drain of the second PMOS transistor and a gate receiving a reference voltage; and
a current source coupled between a common node and a second voltage, the common node being coupled between the source of the first NMOS transistor and a source of the second NMOS transistor.

7. The calibration circuit of claim 6, wherein the first voltage is a power supply voltage and the second voltage is a ground voltage.

8. The calibration circuit of claim 1, wherein the second common-mode feedback circuit includes:
a first current source having a first terminal coupled to a first voltage;
a second current source having a first terminal coupled to the first voltage;
a first PMOS transistor having a source coupled to a second terminal of the first current source and a gate receiving the reference voltage;
a second PMOS transistor having a source coupled to a second terminal of the second current source and a gate receiving the common-mode voltage;
a third PMOS transistor coupled between the second terminal of the first current source and the second terminal of the second current source, the third PMOS transistor having a resistance adjusted based on the gate control signal;
a first NMOS transistor having a drain and a gate commonly coupled to the drain of the first PMOS transistor and a source coupled to a second voltage;
a second NMOS transistor having a gate coupled to the gate of the first NMOS transistor, a source coupled to the second voltage and a drain coupled to one of a first terminal and a second terminal of the at least one terminal of the output port of the mixer; and
a third NMOS transistor having a drain and a gate commonly coupled to the drain of the second PMOS transistor and a source coupled to the second voltage.

9. The calibration circuit of claim 8, wherein the first voltage is a power supply voltage and the second voltage is a ground voltage.

10. The calibration circuit of claim 1, wherein the second common-mode feedback circuit includes:
a first current source having a first terminal coupled to a first voltage;
a second current source having a first terminal coupled to the first voltage;
a first PMOS transistor having a source coupled to the second terminal of the first current source and a gate receiving the reference voltage;
a second PMOS transistor having a source coupled to the second terminal of the second current source and a gate receiving the common-mode voltage;
a third PMOS transistor coupled between the second terminal of the first current source and the second terminal of the second current source, the third PMOS transistor having a resistance adjusted based on the gate control signal.
a first NPN transistor having a collector and a base commonly coupled to the drain of the first PMOS transistor and an emitter coupled to a second voltage;
a second NPN transistor having a base coupled to the based of the first NPN transistor, an emitter coupled to the second voltage and a collector coupled to one of a first terminal and a second terminal of the at least one terminal of the output port of the mixer; and
a third NPN transistor having a collector and a base commonly coupled to the drain of the second PMOS transistor and an emitter coupled to the second voltage.

11. The calibration circuit of claim 10, wherein the first voltage is a power supply voltage and the second voltage is a ground voltage.

12. The calibration circuit of claim 1, wherein the current supply circuit includes:
a first MOS transistor coupled to a power supply voltage and the first terminal of the output port, the first MOS transistor providing a current varying based at least in part on the first common-mode feedback voltage to the first terminal of the output port; and
a second MOS transistor coupled to the power supply voltage and a second terminal of the output port, the second MOS transistor providing a current varying based at least in part on the second common-mode feedback voltage to the second terminal of the output port.

13. The calibration circuit of claim 12, wherein the second common-mode feedback circuit varies an impedance of one of the first and second terminals of the output port in response to the gate control signal.

14. The calibration circuit of claim 1, further comprising:
a third common-mode feedback circuit configured to detect the common-mode voltage of the output port of the mixer, configured to adjust the loop gain in response to a second gate control signal, and configured to adjust a second impedance of a second terminal of the output port of the mixer.

15. The calibration circuit of claim 14, wherein at least one of the first and second gate control signals include a second order Intermodulation (IM2) calibration signal.

16. The calibration circuit of claim 1, wherein the first common-mode feedback circuit varies a second loop gain based on a first control signal to generate the first common-mode feedback voltage, the second common-mode feedback circuit varies the first loop gain based on a second control signal to generate a second common-mode feedback voltage, and the current supply circuit adjusts the current based on the first and second common-mode feedback voltages.

17. The calibration circuit of claim 16, wherein the first control signal and the second control signal include a second order Intermodulation (IM2) calibration signal.

18. The calibration circuit of claim 16, wherein the first common-mode feedback circuit includes:
a first PMOS transistor having a source coupled to a first voltage;
a second PMOS transistor having a source coupled to the first voltage, a drain receiving the common-mode feedback voltage and a gate coupled to the drain of the second PMOS transistor;
a first NMOS transistor having a drain commonly coupled to a gate and drain of the first PMOS transistor and a gate receiving the common-mode voltage;
a second NMOS transistor having a drain coupled to the drain of the second PMOS transistor and a gate receiving a reference voltage;
a third NMOS transistor coupled to the source of the first NMOS transistor and the source of the second NMOS transistor, the third NMOS transistor having a resistance adjusted based on the first control signal;
a first current source coupled between the source of the first NMOS transistor and a second voltage;
a second current source coupled between the source of the second NMOS transistor and the second voltage; and
a current source coupled between a common node and the second voltage, the common node being coupled between the source of the first NMOS transistor and the source of the second NMOS transistor.

19. The calibration circuit of claim 16, wherein the second common-mode feedback circuit includes:
a first PMOS transistor having a source coupled to a first voltage;
a second PMOS transistor having a source coupled to the first voltage, a drain receiving one of the first and second common-mode feedback voltages and a gate coupled to the drain of the second PMOS transistor;
a first NMOS transistor having a drain commonly coupled to the gate and the drain of the first PMOS transistor and a gate receiving the common-mode voltage;
a second NMOS transistor having a drain coupled to the drain of the second PMOS transistor and a gate receiving a reference voltage;
a third NMOS transistor coupled between the source of the first NMOS transistor and the source of the second NMOS transistor, the third NMOS transistor having a resistance adjusted based on the first control signal;
a first current source coupled between the source of the first NMOS transistor and a second voltage; and
a second current source coupled between the source of the second NMOS transistor and the second voltage.

20. A method of calibration, comprising:
detecting a common-mode voltage of an output port of a mixer;
generating at least one common-mode feedback voltage based on the detected common-mode voltage;
adjusting an impedance of at least one terminal of the output port;
applying a current to the output port of the mixer, the applied current based on the at least one common-mode feedback voltage; and
adjusting a loop gain in response to a gate control signal.

21. The method of claim 20, wherein the gate control signal includes a second order Intermodulation (IM2) calibration signal.

* * * * *